(12) United States Patent
Li

(10) Patent No.: US 12,329,018 B2
(45) Date of Patent: Jun. 10, 2025

(54) DISPLAY PANEL

(71) Applicant: Wuhan China Star Optoelectronics Semiconductor Display Technology Co., Ltd., Hubei (CN)

(72) Inventor: Manli Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/790,247

(22) PCT Filed: Jun. 29, 2022

(86) PCT No.: PCT/CN2022/102245
§ 371 (c)(1),
(2) Date: Jun. 30, 2022

(87) PCT Pub. No.: WO2023/240690
PCT Pub. Date: Dec. 21, 2023

(65) Prior Publication Data
US 2024/0180003 A1 May 30, 2024

(30) Foreign Application Priority Data
Jun. 14, 2022 (CN) .......................... 202210669020.2

(51) Int. Cl.
*H10K 59/80* (2023.01)
*H10K 59/40* (2023.01)
(Continued)

(52) U.S. Cl.
CPC .......... *H10K 59/879* (2023.02); *H10K 59/40* (2023.02); *H10K 59/873* (2023.02);
(Continued)

(58) Field of Classification Search
CPC ............ H10K 77/111; H10K 2102/311; H10K 59/40; H10K 59/12; Y02E 10/549
See application file for complete search history.

(56) References Cited

U.S. PATENT DOCUMENTS

| 2024/0032400 A1* | 1/2024 | Sun | ...................... H10K 59/40 |
| 2024/0130177 A1* | 4/2024 | An | ...................... G02F 1/13452 |

FOREIGN PATENT DOCUMENTS

| CN | 105762299 | 7/2016 |
| CN | 112635528 | 4/2021 |

(Continued)

OTHER PUBLICATIONS

International Search Report and the Written Opinion Dated Dec. 20, 2022 From the International Searching Authority Re. Application No. PCT/CN2022/102245 and Its Translation Into English. (17 Pages).

*Primary Examiner* — Victor A Mandala
*Assistant Examiner* — Lawrence C Tynes, Jr.

(57) ABSTRACT

The present disclosure provides a display panel, the display panel includes a substrate, a light-emitting layer, a first refractive layer, and a second refractive layer. The first refractive layer is arranged on a side of the light-emitting layer away from the substrate. The second refractive layer covers a side of the first refractive layer away from the substrate and fills a plurality of openings of the first refractive layer. The second refractive layer extends from a display area to a non-display area and covers a bending area to protect wirings in the bending area, and the second refractive layer may replace a protective glue layer in prior art, which is beneficial to saving processes.

20 Claims, 5 Drawing Sheets

(51) Int. Cl.
*H10K 77/10* (2023.01)
*H10K 102/00* (2023.01)

(52) U.S. Cl.
CPC ....... *H10K 59/8791* (2023.02); *H10K 77/111* (2023.02); *H10K 2102/311* (2023.02); *H10K 2102/351* (2023.02)

(56) References Cited

FOREIGN PATENT DOCUMENTS

| | | | | | |
|---|---|---|---|---|---|
| CN | 112750883 | | 5/2021 | | |
| CN | 113433731 | | 9/2021 | | |
| CN | 113851520 | | 12/2021 | | |
| CN | 113851520 A | * | 12/2021 | ....... | G02F 1/133302 |
| CN | 114220933 | | 3/2022 | | |
| CN | 114220933 A | * | 3/2022 | ......... | H10K 50/8428 |
| KR | 10-2014-0118676 | | 10/2014 | | |

\* cited by examiner

DISPLAY PANEL

RELATED APPLICATIONS

This application is a National Phase of PCT Patent Application No. PCT/CN2022/102245 having International filing date of Jun. 29, 2022, which claims the benefit of priority of Chinese Patent Application No. 202210669020.2 filed on Jun. 14, 2022. The contents of the above applications are all incorporated by reference as if fully set forth herein in their entirety.

FIELD AND BACKGROUND OF THE INVENTION

The present disclosure relates to a field of display technology, and particularly relates to a display panel.

Organic light-emitting diode (OLED) display products have own waveguides and total reflection effects, resulting in a decrease in luminous efficiency. In order to improve the luminous efficiency, a first refractive layer and a second refractive layer are generally added on a light-emitting layer, and a refractive index of the first refractive layer is less than a refractive index of the second refractive layer. Differences between interface angles and refractive indices between the first refractive layer and the second refractive layer are used to improve front light-output and reduce display power consumption of screens. In addition, a narrow border is achieved by bending a bonding area of a display panel to a back of a display area. In order to prevent breakage of wirings in a bending area, it is generally necessary to set a protective glue layer in the bending area to protect the wirings in the bending area. However, an additional process is required to form the protective glue layer, resulting in increased cost.

The embodiments of the present disclosure provide a display panel to solve technical problems that a protective glue layer is provided for preventing breakage of wirings in a bending area in an existing display panel requires an additional process, resulting in increased cost.

In order to solve above problems, technical solutions provided by the present disclosure are as follows:

The present disclosure provides a display panel, including a display area and a non-display area, the non-display area includes a bonding area and a bending area located between the display area and the bonding area;

the display panel further includes:
a substrate;
a light-emitting layer arranged on a side of the substrate and located in the display area, the light-emitting layer includes a plurality of sub-pixels;
a first refractive layer arranged on a side of the light-emitting layer away from the substrate, the first refractive layer includes a plurality of openings defined in the display area, and the plurality of openings are arranged corresponding to the plurality of sub-pixels;
a second refractive layer covering a side of the first refractive layer away from the substrate and filling the openings, a refractive index of the second refractive layer is greater than a refractive index of the first refractive layer, and the second refractive layer extends from the display area to the non-display area and covers the bending area; and
a first backplane and a second backplane, the first backplane is located on a side of the substrate facing the second backplane and located in the display area, and the second backplane is located on a side of the substrate facing the first backplane and located in the bonding area.

According to the display panel provided by the present disclosure, the first refractive layer and the bending area are spaced and are not overlapped.

According to the display panel provided by the present disclosure, a thickness of the second refractive layer in the display area is less than a thickness of the second refractive layer in the bending area.

According to the display panel provided by the present disclosure, the second refractive layer includes a main body part and a leveling part connected to each other, at least a part of the main body part is located in the display area, and the leveling part is formed by extending from the main body part along a direction from the display area to the bending area, and a thickness of the leveling part is gradually decreased accordingly, and a thickness of the main body part is equal at each position.

According to the display panel provided by the present disclosure, the leveling part is located between the bending area and the bonding area.

According to the display panel provided by the present disclosure, the display panel further includes a polarizer; the polarizer is arranged on a side of the second refractive layer away from the substrate and located in the display area, and a side surface of the main body part away from the substrate is in contact with a side surface of the polarizer close to the substrate.

According to the display panel provided by the present disclosure, the display panel further includes a retaining wall arranged between the bending area and the bonding area, and the second refractive layer covers the bending area and extends to the retaining wall.

According to the display panel provided by the present disclosure, a material of the retaining wall and a material of the first refractive layer are same.

According to the display panel provided by the present disclosure, the display panel further includes:
an encapsulation layer arranged between the light-emitting layer and the first refractive layer, the encapsulation layer covers the light-emitting layer and extends between the display area and the bending area; and
a touch stack structure arranged on a side of the encapsulation layer away from the substrate, the touch stack structure includes a first insulating layer, a first metal layer, a second insulating layer, a second metal layer, and the first refractive layer stacked in sequence, and touch electrodes are arranged in the first metal layer or the second metal layer.

The present disclosure provides a display panel, including a display area and a non-display area, the non-display area includes a bonding area and a bending area located between the display area and the bonding area;

the display panel further includes:
a substrate;
a light-emitting layer arranged on a side of the substrate and located in the display area, the light-emitting layer includes a plurality of sub-pixels;
a first refractive layer, arranged on a side of the light-emitting layer away from the substrate, the first refractive layer includes a plurality of openings defined in the display area, and the plurality of openings are arranged corresponding to the plurality of sub-pixels; and
a second refractive layer covering a side of the first refractive layer away from the substrate and filling the openings, a refractive index of the second refractive layer is greater than a refractive index of the first refractive layer, and the second refractive layer extends from the display area to the non-display area and covers the bending area.

According to the display panel provided by the present disclosure, the first refractive layer and the bending area are spaced and are not overlapped.

According to the display panel provided by the present disclosure, a thickness of the second refractive layer in the display area is less than a thickness of the second refractive layer in the bending area.

According to the display panel provided by the present disclosure, the second refractive layer includes a main body part and a leveling part connected to each other, at least a part of the main body part is located in the display area, the leveling part is formed by extending from the main body part along a direction from the display area to the bending area, and a thickness of the leveling part is gradually decreased accordingly, and a thickness of the main body part is equal at each position.

According to the display panel provided by the present disclosure, the leveling part is located between the bending area and the bonding area.

According to the display panel provided by the present disclosure, the display panel further includes a polarizer; the polarizer is arranged on a side of the second refractive layer away from the substrate and located in the display area, a side surface of the main body part away from the substrate is in contact with a side surface of the polarizer close to the substrate.

According to the display panel provided by the present disclosure, the display panel further includes a retaining wall arranged between the bending area and the bonding area, and the second refractive layer covers the bending area and extends to the retaining wall.

According to the display panel provided by the present disclosure, a material of the retaining wall and a material of the first refractive layer are same.

According to the display panel provided by the present disclosure, a thickness of the retaining wall and a thickness of the first refractive layer are same.

According to the display panel provided by the present disclosure, the display panel further includes a polarizer; the polarizer is arranged on a side of the second refractive layer away from the substrate;

wherein the polarizer at least covers the first refractive layer, and the polarizer and the bending area are spaced and are not arranged overlapped.

According to the display panel provided by the present disclosure, the display panel further includes:

an encapsulation layer arranged between the light-emitting layer and the first refractive layer, the encapsulation layer covers the light-emitting layer and extends between the display area and the bending area; and a touch stack structure arranged on a side of the encapsulation layer away from the substrate, the touch stack structure includes a first insulating layer, a first metal layer, a second insulating layer, a second metal layer, and the first refractive layer stacked in sequence, and touch electrodes are arranged in the first metal layer or the second metal layer.

Beneficial effects of the present disclosure are: a display panel is provided by the present disclosure; by extending a second refractive layer from a display area to a non-display area and covering a bending area, and configuring the second refractive layer to protect wirings in the bending area, the second refractive layer may replace a protective glue layer located in the bending area in prior art. Since the protective glue layer does not need to be provided, the present disclosure does not need to add another process for manufacturing the protective glue layer, which is beneficial to saving a process and reducing production cost.

BRIEF DESCRIPTION OF THE SEVERAL VIEWS OF THE DRAWINGS

To describe the technical solutions of the embodiments of the present disclosure more clearly, the following briefly introduces the accompanying drawings used in the description of the embodiments of the present disclosure. The accompanying drawings described below illustrate only some exemplary embodiments of the present disclosure, and persons skilled in the art may derive other drawings from the drawings without making creative efforts.

Figure 1A:
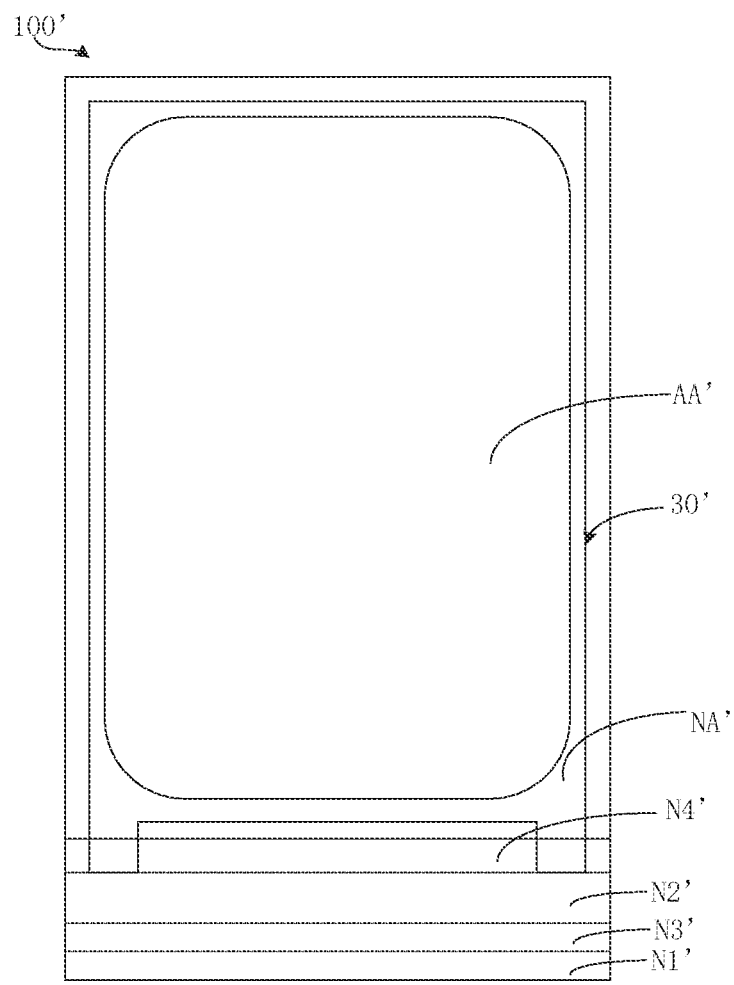
FIG. 1A is a plan schematic structural diagram of a display panel in prior art.

Descriptions of reference marks:
100', display panel; AA', display area; NA', non-display area; N1', bonding area; N2', bending area; N3', first plane area; N4', second plane area; 10', substrate; 201', first refractive layer; 202', second refractive layer; 2022', leveling part; 30', polarizer; 40', retaining wall; 50', protective glue layer;
100, display panel; AA, display area; NA, non-display area; N1, bonding area; N2, bending area; N3, first plane area; N4, second plane area;
10, substrate; 101, driver circuit layer; 102, display device layer; 1021, anode; 1022, pixel definition layer; 1023, light-emitting layer; 103, encapsulation layer; 104, touch stack structure; 1041, first insulating layer; 1042, first metal layer; 1043, second insulating layer; 1044, second metal layer; 201, first refractive layer; 2011, openings; 202, second refractive layer; 2021, main body part; 2022, leveling part; 30, polarizer; 40, retaining wall; 50, first backplane; 60, second backplane; 70, buffer layer; 80, reinforcing plate; 901, driver chip; 902, flexible circuit board.

DESCRIPTION OF SPECIFIC EMBODIMENTS OF THE INVENTION

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure. In addition, it should be understood that the specific embodiments described herein are only used to illustrate and explain the present disclosure, but not to limit the present disclosure. In this present disclosure, unless otherwise stated, the directional words used such as "upper" and "lower" generally refer to the upper and lower parts of the device in actual use or working state, specifically the direction of the drawing in the drawings; while "inside" and "outside" refer to the outline of the device.

Figure 1B:
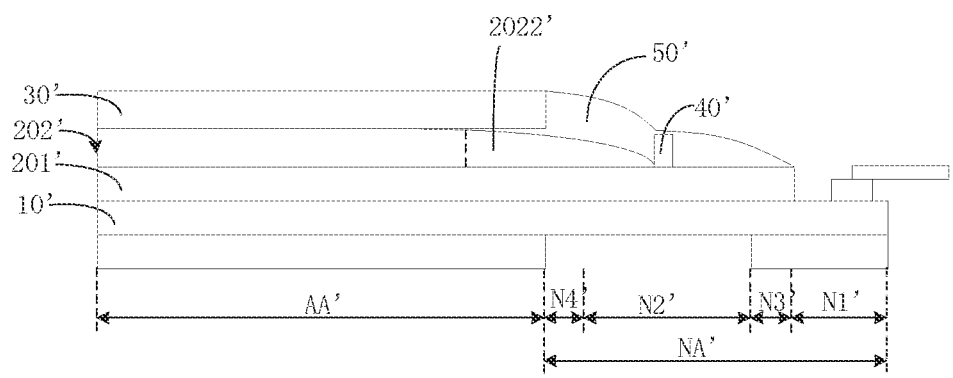
FIG. 1B is a cross-sectional schematic structural diagram of the display panel in the prior art when unfolded.
Figure 1C:
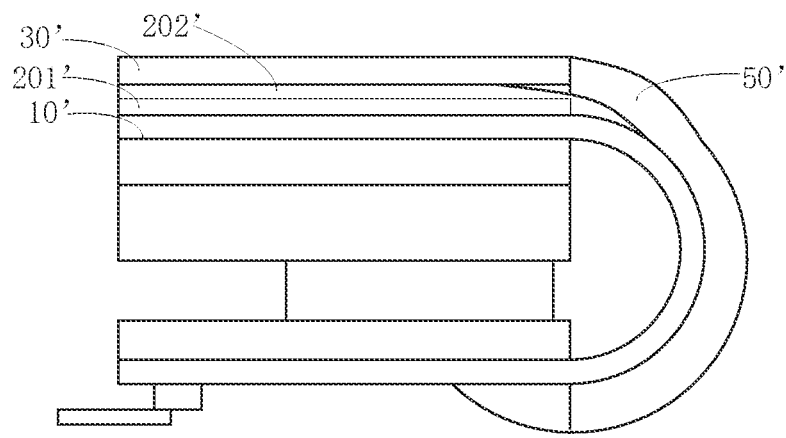
FIG. 1C is a cross-sectional schematic structural diagram of the display panel in the prior art after being bent.
Figure 2:
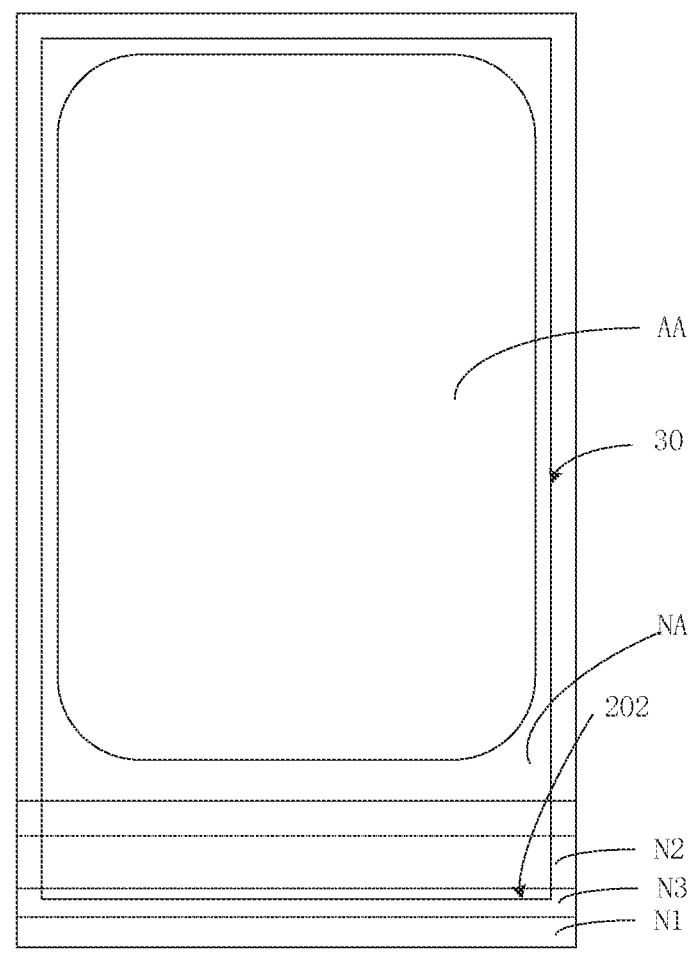
FIG. 2 is a plan schematic structural diagram of a display panel provided by an embodiment of the present disclosure.

Referring to FIG. 1A, FIG. 1B, and FIG. 1C, FIG. 1A is a plan schematic structural diagram of a display panel in prior art. FIG. 1B is a cross-sectional schematic structural diagram of the display panel in the prior art when unfolded. FIG. 1C is a cross-sectional schematic structural diagram of the display panel in the prior art after being bent.

A display panel 100' in the prior art includes a substrate 10', a first refractive layer 201', a second refractive layer 202', and a protective glue layer 50', and the substrate 10' includes a display area AA' and a non-display area NA'. The non-display area NA' includes a bonding area N1' and a bending area N2' located between the display area AA' and the bonding area N1'. The second refractive layer 202' is arranged on a side of the substrate 10' and located in the display area AA'. The protective glue layer 50' is arranged on the side of the substrate 10' and located in the bending area N2' to protect wirings located in the bending area N2' of the display panel 10'. The protective glue layer 50' needs to be manufactured by a separate process, resulting in increased cost.

In view of this, the present disclosure provides a display panel; compared with the prior art, a second refractive layer of the present disclosure extends from a display area to a non-display area and covers a bending area, the second refractive layer may be configured to protect wirings in the bending area, and the second refractive layer may replace the protective glue layer 50' in the bending area N2' in the prior art. Since the protective glue layer 50' does not need to be provided, the present disclosure does not need to add another process for manufacturing the protective glue layer 50', which is beneficial to saving the process and reducing production cost.

In order to better understand the technical solutions and technical effects of the present disclosure, specific embodiments will be described in detail below with reference to accompanying drawings.

Figure 3A:
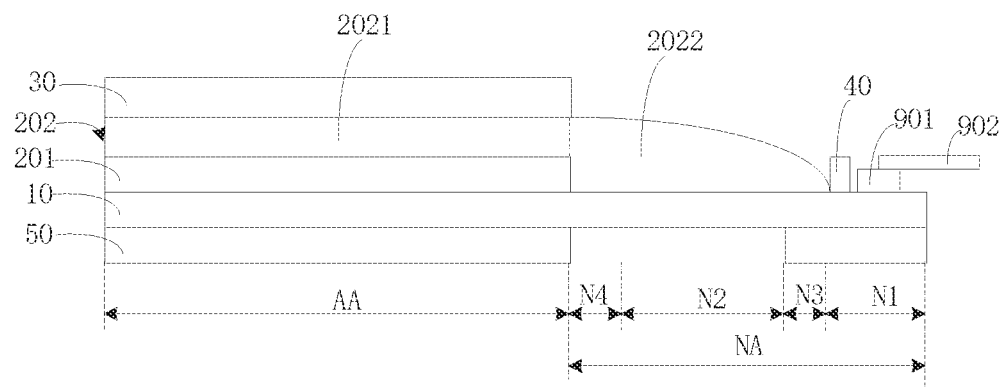
FIG. 3A is a first simplified cross-sectional schematic structural diagram of the display panel provided by an embodiment of the present disclosure when unfolded.
Figure 3B:
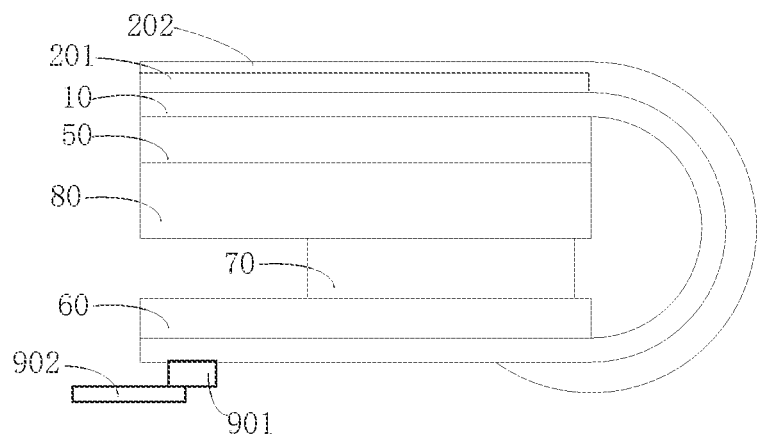
FIG. 3B is a cross-sectional schematic structural diagram of the display panel in FIG. 3A after being bent.
Figure 4:
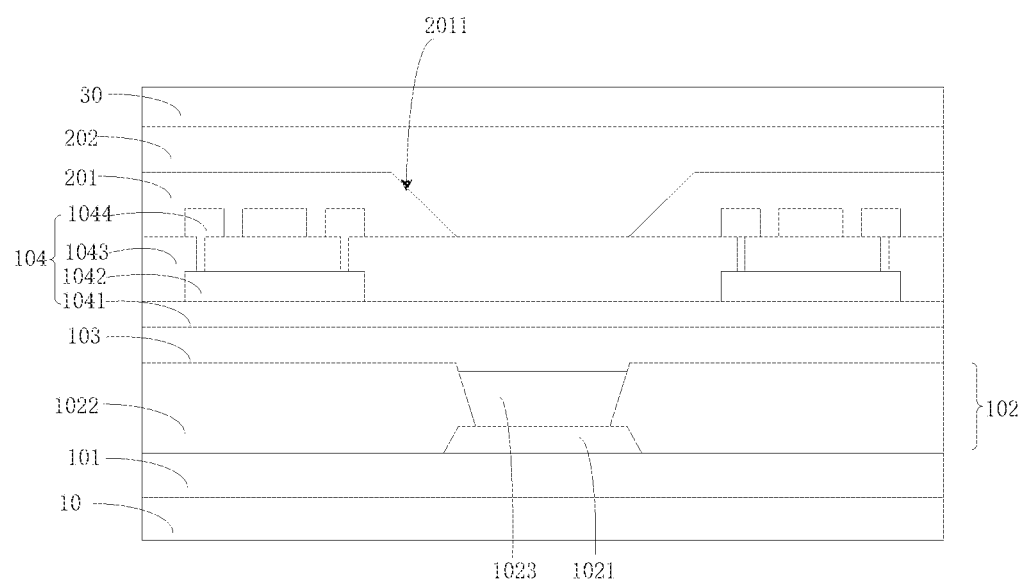
FIG. 4 is a detailed cross-sectional schematic structural diagram of the display panel provided by an embodiment of the present disclosure when unfolded.

Referring to FIG. 2, FIG. 3A, FIG. 3B, and FIG. 4, FIG. 2 is a plan schematic structural diagram of a display panel provided by an embodiment of the present disclosure. FIG. 3A is a first simplified cross-sectional schematic structural diagram of the display panel provided by an embodiment of the present disclosure when unfolded. FIG. 3B is a cross-sectional schematic structural diagram of the display panel in FIG. 3A after being bent. FIG. 4 is a detailed cross-sectional schematic structural diagram of the display panel provided by an embodiment of the present disclosure when unfolded.

The display panel 100 provided in an embodiment of the present disclosure includes a substrate 10, a light-emitting layer 1023, a first refractive layer 201, and a second refractive layer 202. The display panel 100 includes a display area AA and a non-display area NA. The non-display area NA includes a bonding area N1 and a bending area N2 located between the display area AA and the bonding area N1. The display area AA is an area for displaying, and the bonding area N1 is an area for bonding external circuits. The bending area N2 may be bent for bending the bonding area N1 to a back of the display area AA to achieve a narrow border. The "back" here refers to a non-display surface of the display panel 100, and a surface opposite to the "back" is a display surface of the display panel 100.

The light-emitting layer 1023 is arranged on a side of the substrate 10 and located in the display area AA, the light-emitting layer 1023 includes a plurality of sub-pixels. The first refractive layer 201 is arranged on a side of the light-emitting layer 1023 away from the substrate 10. The first refractive layer 201 includes a plurality of openings 2011 defined in the display area AA, and the plurality of openings 2011 are arranged corresponding to the plurality of sub-pixels. The second refractive layer 202 covers a side of the first refractive layer 201 away from the substrate 10 and fills the openings 2011. A refractive index of the second refractive layer 202 is greater than a refractive index of the first refractive layer 201, so that light emitted by the light-emitting layer 1023 may be totally reflected at an interface between the first refractive layer 201 and the second refractive layer 202, thereby the light is converged to improve a front light-output and reduce display power consumption of a screen.

The second refractive layer 202 extends from the display area AA to the non-display area NA and covers the bending area N2, the second refractive layer 202 may protect the wirings located in the bending area N2, lift a neutral layer, and prevent breakage of the wirings, therefore the second refractive layer 202 may replace the protective glue layer 50' located in the bending area N2' in the prior art. Since the protective glue layer 50' does not need to be provided, the present disclosure does not need to add an additional process for manufacturing the protective glue layer 50', which is beneficial to saving the process and reducing the production cost.

The display panel 100 includes a flexible display panel. The display panel 100 further includes a driver circuit layer 101 and a display device layer 102, the driver circuit layer 101 is arranged on the side of the substrate 10, and the display device layer 102 is arranged on a side of the driver circuit layer 101 away from the substrate 10 and located in the display area AA. A material of the substrate 10 may be a material having good flexibility, such as polyimide, polycarbonate, polyethylene terephthalate, and silica gel, etc. The driver circuit layer 101 includes an active matrix driver circuit or a passive matrix driver circuit. The driver circuit layer 101 includes a plurality of wirings, and the plurality of wirings extend from the display area AA through the bending area N2 to the bonding area N1. The display device layer 102 includes the light-emitting layer 1023; specifically, the display device layer 102 further includes an anode 1021, a pixel definition layer 1022, a hole injection layer, a hole transport layer, an electron transport layer, an electron injection layer, and a cathode. The light-emitting layer 1023 is located in a plurality of pixel openings defined by the pixel definition layer 1022 and located between the electron transport layer and the hole transport layer.

Furthermore, an encapsulation layer 103 is further arranged on a side of the display device layer 102 away from the substrate 10 for encapsulating the light-emitting layer 1023. The encapsulation layer 103 mainly isolates the light-emitting layer 1023 from an external environment to prevent intrusion of moisture, harmful gases, dust, and rays, and to prevent a failure of organic light-emitting materials caused by external force damage to stabilize various parameters of devices and further improve a service life of the display panel 100.

A touch stack structure 104 is further arranged on a side of the encapsulation layer 103 away from the substrate 10, the touch stack structure 104 is located in the display area AA. The touch stack structure 104 includes a first insulating layer 1041, a first metal layer 1042, a second insulating layer 1043, a second metal layer 1044, and the first refractive layer 201 stacked in sequence, and touch electrodes are arranged in the first metal layer 1042 or the second metal layer 1044. In the embodiment of the present disclosure, the first refractive layer 201 is a part of the touch stack structure 104, that is, the first refractive layer 201 is multiplexed as an insulating layer in the touch stack structure 104. Therefore, there is no need to provide another insulating layer covering the second metal layer 1044 between the first refractive layer 201 and the second metal layer 1044, which may reduce an overall thickness of the display panel 100. The touch stack structure 104 may adopt a direct cell touch (DOT) method on the screen.

It should be noted that, although not shown in figures, the display panel 100 further includes other film layer structures not shown in the figures, such as a cover plate, a barrier layer, etc.

Continue to refer to FIG. 3B, the display panel 100 further includes a first backplane 50 and a second backplane 60 for supporting the substrate 10 and above film layers. The first backplane 50 and the second backplane 60 are arranged opposite to each other; the first backplane 50 is located on a side of the substrate 10 facing the second backplane 60 and located in the display area AA, and the second backplane 60 is located on a side of the substrate 10 facing the first backplane 50 and located in the bonding area N1. The first backplane 50 and the second backplane 60 are disconnected.

The display panel 100 further includes a buffer layer 70 and a reinforcing plate 80. The buffer layer 70 and the reinforcing plate 80 is located between the first backplane 50 and the second backplane 60, and the reinforcing plate 80 is located between the second backplane 60 and the buffer layer 70.

The second refractive layer 202 extends from the display area AA to the bending area N2. A material of the second refractive layer 202 is transparent flowing liquid; while ensuring that the light-output is not affected, a part of the second refractive layer 202 extending to the bending area N2 may play a role of the protective glue layer 50' in the prior art.

In the embodiment of the present disclosure, the first refractive layer 201 and the bending area N2 are spaced and are not overlapped; that is, the first refractive layer 201 is only located in the display area AA, and the first refractive layer 201 is not arranged in the bending area N2.

Since in the display area AA, there are film layers, such as the encapsulation layer 103, the touch stack structure 104, and the first refractive layer 201, etc., between the light-emitting layer 1023 and the second refractive layer 202, and the film layers above are only located in the display area AA, but not provided in the bending area N2, therefore, between the light-emitting layer 1023 and the second refractive layer 202, a number of film layers located in the display area AA is substantially less than a number of film layers located in the bending area N2. Then, a thickness of the second refractive layer 202 in the display area AA is less than a thickness of the second refractive layer 202 in the bending area N2.

The second refractive layer 202 includes a main body part 2021 and a leveling part 2022 connected to each other; at least a part of the main body part 2021 is located in the display area AA, the leveling part 2022 is formed by extending the main body part 2021 along a direction from the display area AA towards the bending area N2, and a thickness of the leveling part 2022 is gradually decreased accordingly. The second refractive layer 202 is manufactured by an inkjet printing process, and due to process reasons, a thickness of a print cut-off end of the second refractive layer 202 (that is, the leveling part 2022) is gradually reduced; and the main body part 2021 is a part without being leveled, and a thickness thereof at each position is equal.

The display panel 100 further includes a polarizer 30 to increase light transmission and reduce reflection of external light. The polarizer 30 is arranged on a side of the second refractive layer 202 away from the substrate 10 and located in the display area AA. Wherein the polarizer 30 at least covers the first refractive layer 201, and the polarizer 30 and the bending area N2 are spaced and are not overlapped. A photosensitive adhesive layer may further be arranged between the polarizer 30 and the second refractive layer 202.

Continue to refer to FIG. 1A, FIG. 1B, and FIG. 1C again, applicants further found that, in the prior art, a part of the leveling part 2022' of the second refractive layer 202' is located inside the polarizer 30', and another part is located outside the polarizer 30'. Since a thickness of the leveling part 2022' tends to decrease gradually in a direction along the display area AA' pointing to the bending area N2', a gap exists between the leveling part 2022' located inside the polarizer 30' and the polarizer 30', making bubbles accumulate easily in the gap, thereby causing a display effect of the display panel 100' to become worse.

However, the leveling part 2022 of the present disclosure is located in the bending area N2, but not arranged in the display area AA; that is, all the leveling part 2022 is located outside the polarizer 30, and only the main body part 2021 is located inside the polarizer 30. And since the thickness of the main body part 2021 is equal at each position, making a side surface of the main body part 2021 away from the substrate 10 be in contact with a side surface of the polarizer 30 close to the substrate 10. Therefore, the gap between the second refractive layer 202' and the polarizer 30' in the prior art is eliminated, and the bubbles do not exist between the polarizer 30 and the second refractive layer 202, which is conducive to improving a display effect of the display panel 100.

A first plane area N3 is arranged between the bending area N2 and the bonding area N1, and two ends of the first plane area N3 are respectively connected with the bending area N2 and the bonding area N1. In order to limit a leveling distance of the leveling part 2022, and to prevent printing solvents from diffusing into the bonding area N1 during inkjet printing to cause pollution and damage to a driving chip 901 and a flexible circuit board 902 arranged in the bonding area N1, the display panel 100 further includes a retaining wall 40; the retaining wall 40 is arranged in the first plane area N3, and the second refractive layer 202 covers the bending area N2 and extends to the retaining wall 40; that is, an end of the leveling part 2022 away from the main body part 2021 is in contact with the retaining wall 40, and printing of the leveling part 2022 is cut off at the retaining wall 40. Compared with the retaining wall 40' located in the bonding area N2' or an area between the display area AA' and the bending area N2' (that is, the second plane area N4') in the prior art, a distance between the retaining wall 40 in the present disclosure and the display area AA is increased to make the leveling part 2022 be formed outside the display area AA, the gap existing between the second refractive layer 202' and the polarizer 30' may be eliminated, and the display effect of the display panel 100 is improved.

In an actual manufacturing process, the retaining wall 40 may be formed in the bending area N2 by photolithography, then, the first refractive layer 201 and the second refractive layer 202 are formed. Certainly, a manufacturing process of the retaining wall 40 is not limited thereto. In the present disclosure, a material of the retaining wall 40 and a material of the first refractive layer 201 are same; that is, the retaining wall 40 and the first refractive layer 201 are arranged in a same layer, and the retaining wall 40 and the first refractive layer 201 are manufactured by a same process, which is beneficial to further saving the process. Specifically, after the touch stack structure 104 is manufactured, firstly, the first refractive layer 201 and the retaining wall 40 are formed, and then the second refractive layer 202 is formed on the first refractive layer 201. In this case, a thickness of the retaining wall 40 is same as a thickness of the first refractive layer 201.

Furthermore, the retaining wall 40 is located at an edge of the first plane area N3 near the bonding area N1, and coverage of a printing area may be increased to make room for the leveling part 2022, thereby ensuring that the leveling part 2022 is not formed in the display area AA. Generally, a size of the leveling part 2022 in a direction of the display area AA pointing to the bonding area N1 ranges from 2.5 mm to 3 mm. Therefore, a size of the the first plane area N3 of the present disclosure in the direction of the display area AA pointing to the bonding area N1 ranges from 3 mm to 4 mm, to ensure that a sufficient space may be reserved for the leveling part 2022 without increasing a lower border of the display panel 100 at a same time.

Figure 5:
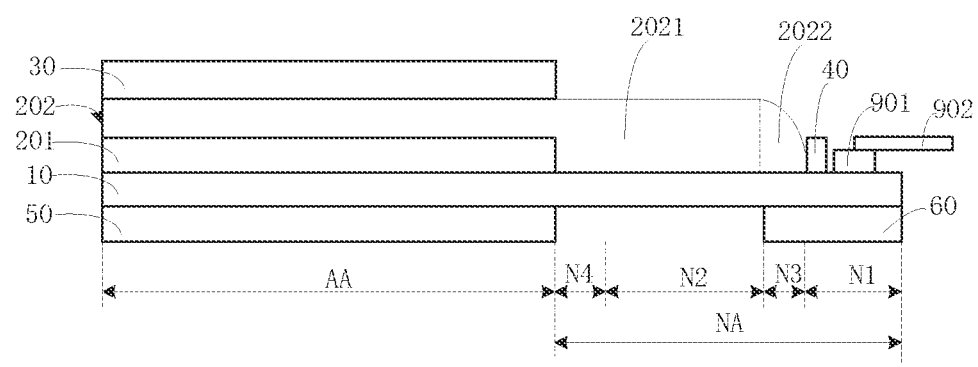
FIG. 5 is a second simplified cross-sectional schematic structural diagram of the display panel provided by an embodiment of the present disclosure when unfolded.

Furthermore, referring to FIG. 5, FIG. 5 is a second simplified cross-sectional schematic structural diagram of the display panel provided by an embodiment of the present disclosure when unfolded. FIG. 5 differs from FIG. 3A in that, the leveling part 2022 is located between the bending area N2 and the bonding area N1 to make the thickness of the second refractive layer 202 located in the bending area N2 uniform, thereby the wirings located in the bending area N2 are evenly stressed to prevent breakage from happening.

Continue to refer to FIG. 3A, the retaining wall 40 may have a variety of specific arrangements; specifically, a height of the retaining wall 40 may range from 1 μm to 3 μm, and a width of the retaining wall 40 may be range from 10 μm to 20 μm. A specific value of the height of the retaining wall 40 may be set according to actual demands, so that ink does not splash to an area outside a preset printing area during the inkjet printing process.

Specifically, a material with high viscosity is selected for the second refractive layer 202 to reduce a size of the leveling part 2022 in the direction of the display area AA pointing to the bonding area N1.

Specifically, a material of the retaining wall 40 may be an organic material, such as anyone of organic materials of acrylic series, epoxy resin series, and silicon-based series.

Referring to FIG. 1A, FIG. 1B, and FIG. 1C again, applicants further found that, in the prior art, printing of the second refractive layer 202' located in a central area is cut off at an inside of the polarizer 30', while printing of the second refractive layer 202' located in left and right borders is cut off at an outside of the polarizer 30'. A part of the protective glue layer 50' overlaps the second refractive layer 202' located on an outside, and another part of the protective glue layer 50' does not overlap the second refractive layer 202'; therefore, a thickness of an overlapping part of the protective glue layer 50' is greater than a thickness of a non-overlapping part of the protective glue layer 50', resulting in an uneven thickness of the protective glue layer 50' in the bending area N2', thereby causing uneven stress on the wirings in the bending area N2' and breakage occurs easily.

However, the second refractive layer 202 of the present disclosure replaces the protective glue layer 50' in the prior art, therefore, there is no part where the protective glue layer 50' overlaps the second refractive layer 202 of the present disclosure, and since the thickness of the leveling part 2022 of the present disclosure shows a gentle thinning trend, compared with the prior art, it is possible to improve an undesirable situation that the wirings located in the bending area N2 are easy to break due to uneven stress.

Figure 6:
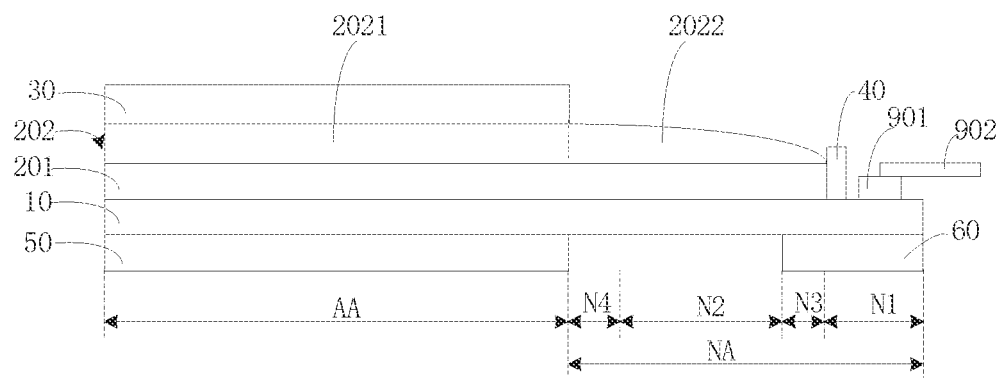
FIG. 6 is a third simplified cross-sectional schematic structural diagram of the display panel provided by an embodiment of the present disclosure when unfolded.

In an embodiment, referring to FIG. 6, FIG. 6 is a third simplified cross-sectional schematic structural diagram of the display panel provided by an embodiment of the present disclosure when unfolded. FIG. 6 differs from FIG. 3A in that, both the first refractive layer 201 and the second refractive layer 202 extend from the display area AA to the non-display area NA and cover the bending area N2. The retaining wall 40 may be located on the side of the first refractive layer 201 away from the substrate 10, or may be also located on the substrate 10. The first refractive layer 201 and the second refractive layer 202 jointly replace the protective glue layer 50' in the prior art; while reducing a process effect, thickness unevenness of the protective glue layer 50' in the bending area N2' in the prior art may be improved, and the gap between the second refractive layer 202' and the polarizer 30' is eliminated; for details, please refer to the above descriptions.

Beneficial effects are: the display panel is provided by the present disclosure; by extending the second refractive layer from the display area to the non-display area and covering the bending area, and configuring the second refractive layer to protect the wirings in the bending area, the second refractive layer may replace the protective glue layer located in the bending area in the prior art. Since the protective glue layer does not need to be provided, the present disclosure does not need to add another process for manufacturing the protective glue layer, which is beneficial to saving the process and reducing the production cost.

In summary, although the present disclosure has been disclosed in the above preferred embodiments, the above preferred embodiments do not intend to limit the present disclosure. Various modifications and changes may be made by ordinary person skilled in the art without departing from the spirit and scope of this disclosure. Therefore, the scope of protection of this application is subject to the scope defined by the claims.

What is claimed is:

1. A display panel, comprising a display area and a non-display area, wherein the non-display area comprises a bonding area and a bending area located between the display area and the bonding area;
   the display panel further comprises:
   a substrate;
   a light-emitting layer arranged on a side of the substrate and located in the display area, wherein the light-emitting layer comprises a plurality of sub-pixels;
   a first refractive layer arranged on a side of the light-emitting layer away from the substrate, wherein the first refractive layer comprises a plurality of openings defined in the display area, and the plurality of openings are arranged corresponding to the plurality of sub-pixels;

a second refractive layer covering a side of the first refractive layer away from the substrate and filling the openings, wherein a refractive index of the second refractive layer is greater than a refractive index of the first refractive layer, and the second refractive layer extends from the display area to the non-display area and covers the bending area; and a first backplane and a second backplane, wherein the first backplane is located on a side of the substrate facing the second backplane and located in the display area, and the second backplane is located on a side of the substrate facing the first backplane and located in the bonding area.

2. The display panel according to claim 1, wherein the first refractive layer and the bending area are spaced and are not overlapped.

3. The display panel according to claim 2, wherein a thickness of the second refractive layer in the display area is less than a thickness of the second refractive layer in the bending area.

4. The display panel according to claim 3, wherein the second refractive layer comprises a main body part and a leveling part connected to each other; at least a part of the main body part is located in the display area, and the leveling part is formed by extending the main body part along a direction from the display area towards the bending area, and a thickness of the leveling part is gradually decreased accordingly, and a thickness of the main body part is equal at each position.

5. The display panel according to claim 4, wherein the leveling part is located between the bending area and the bonding area.

6. The display panel according to claim 4, wherein the display panel further comprises a polarizer; the polarizer is arranged on a side of the second refractive layer away from the substrate and located in the display area, and a side surface of the main body part away from the substrate is in contact with a side surface of the polarizer close to the substrate.

7. The display panel according to claim 1, wherein the display panel further comprises a retaining wall arranged between the bending area and the bonding area, and the second refractive layer covers the bending area and extends to the retaining wall.

8. The display panel according to claim 7, wherein a material of the retaining wall and a material of the first refractive layer are same.

9. The display panel according to claim 1, wherein the display panel further comprises:

an encapsulation layer arranged between the light-emitting layer and the first refractive layer, wherein the encapsulation layer covers the light-emitting layer and extends between the display area and the bending area; and a touch stack structure arranged on a side of the encapsulation layer away from the substrate, wherein the touch stack structure comprises a first insulating layer, a first metal layer, a second insulating layer, a second metal layer, and the first refractive layer stacked in sequence, and touch electrodes are arranged in the first metal layer or the second metal layer.

10. A display panel, comprising a display area and a non-display area, wherein the non-display area comprises a bonding area and a bending area located between the display area and the bonding area;

the display panel further comprises:

a substrate;

a light-emitting layer arranged on a side of the substrate and located in the display area, wherein the light-emitting layer comprises a plurality of sub-pixels;

a first refractive layer arranged on a side of the light-emitting layer away from the substrate, wherein the first refractive layer comprises a plurality of openings defined in the display area, and the plurality of openings are arranged corresponding to the plurality of sub-pixels; and a second refractive layer covering a side of the first refractive layer away from the substrate and filling the openings, wherein a refractive index of the second refractive layer is greater than a refractive index of the first refractive layer, and the second refractive layer extends from the display area to the non-display area and covers the bending area.

11. The display panel according to claim 10, wherein the first refractive layer and the bending area are spaced and are not overlapped.

12. The display panel according to claim 11, wherein a thickness of the second refractive layer in the display area is less than a thickness of the second refractive layer in the bending area.

13. The display panel according to claim 12, wherein the second refractive layer comprises a main body part and a leveling part connected to each other, at least a part of the main body part is located in the display area, the leveling part is formed by extending the main body part along a direction from the display area towards the bending area, and a thickness of the leveling part is gradually decreased accordingly, and a thickness of the main body part is equal at each position.

14. The display panel according to claim 13, wherein the leveling part is located between the bending area and the bonding area.

15. The display panel according to claim 13, wherein the display panel further comprises a polarizer; the polarizer is arranged on a side of the second refractive layer away from the substrate and located in the display area, and a side surface of the main body part away from the substrate is in contact with a side surface of the polarizer close to the substrate.

16. The display panel according to claim 10, wherein the display panel further comprises a retaining wall arranged between the bending area and the bonding area, and the second refractive layer covers the bending area and extends to the retaining wall.

17. The display panel according to claim 16, wherein a material of the retaining wall and a material of the first refractive layer are same.

18. The display panel according to claim 16, wherein a thickness of the retaining wall and a thickness of the first refractive layer are same.

19. The display panel according to claim 10, wherein the display panel further comprises a polarizer and the polarizer is arranged on a side of the second refractive layer away from the substrate; and wherein the polarizer at least covers the first refractive layer, and the polarizer and the bending area are spaced and are not overlapped.

20. The display panel according to claim 10, wherein the display panel further comprises:
- an encapsulation layer arranged between the light-emitting layer and the first refractive layer, wherein the encapsulation layer covers the light-emitting layer and extends between the display area and the bending area; and
- a touch stack structure arranged on a side of the encapsulation layer away from the substrate, wherein the touch stack structure comprises a first insulating layer, a first metal layer, a second insulating layer, a second metal layer, and the first refractive layer stacked in sequence, and touch electrodes are arranged in the first metal layer or the second metal layer.

* * * * *